United States Patent [19]

Takemae et al.

[11] 4,267,464
[45] May 12, 1981

[54] DECODER CIRCUIT

[75] Inventors: Yoshihiro Takemae, Kawasaki; Masao Nakano, Tokyo, both of Japan

[73] Assignee: Fujitsu Fanuc Limited, Japan

[21] Appl. No.: 968,990

[22] Filed: Dec. 13, 1978

[30] Foreign Application Priority Data

Dec. 30, 1977 [JP] Japan .................................. 52-158437

[51] Int. Cl.³ ................. H03K 19/017; H03K 19/096; G11C 8/00
[52] U.S. Cl. .................................. 307/463; 307/270; 307/DIG. 5; 307/482; 365/230
[58] Field of Search ............... 307/205, 208, 262, 270, 307/DIG. 4, DIG. 5; 365/230

[56] References Cited

U.S. PATENT DOCUMENTS

| | | | |
|---|---|---|---|
| 3,644,904 | 2/1972 | Baker | 307/DIG. 5 X |
| 3,665,473 | 5/1972 | Heimbigner | 307/DIG. 5 X |
| 3,795,898 | 3/1974 | Mehta et al. | 307/DIG. 5 X |
| 4,048,629 | 9/1977 | Bormann | 365/230 |
| 4,074,237 | 2/1978 | Spampinato | 365/230 |
| 4,081,699 | 3/1978 | Hirt et al. | 307/DIG. 5 X |
| 4,087,044 | 5/1978 | Hofmann | 307/DIG. 5 X |
| 4,087,704 | 5/1978 | Mehta et al. | 307/DIG. 4 X |
| 4,145,622 | 3/1979 | Hofmann et al. | 307/205 X |

OTHER PUBLICATIONS

Parikh "High-Speed FET Decoder", *IBM Tech. Discl. Bull.*, vol. 18, No. 12, pp. 3955-3956, 5/1976.
De Simone "High-Speed FET Decoder Circuit", *IBM Tech. Discl. Bull.*, vol. 17, No. 10, pp. 2835-2836, 3/1975.

*Primary Examiner*—Larry N. Anagnos
*Attorney, Agent, or Firm*—Staas & Halsey

[57] ABSTRACT

A decoder circuit including: a charge-up transistor for maintaining the content of an input address signal; a power supply switching transistor for controlling a charge-up current which is supplied to the charge-up transistor; a predetermined number of selection transistors which are connected at a connection point between the charge-up transistor and the power supply switching transistor so as to select an output word line, and; a bootstrap transistor which is connected to an opposite side of the connection point with respect to the charge-up transistor. The present invention enables the driving of the charge-up transistor with clock pulses having a potential level higher than the power supply line voltage $V_{DD}$. The present invention also enables the driving of the power supply switching transistor by clock pulses having a potential level higher than $V_{DD}+V_{th}$ wherein $V_{+h}$ equals the threshold voltage of the power supply switching transistor.

10 Claims, 8 Drawing Figures

DECODER CIRCUIT

CROSS REFERENCE TO RELATED APPLICATIONS

This application is related to Ser. No. 964,186, filed Nov. 28, 1978 entitled DECODER CIRCUIT.

FIELD OF THE INVENTION

The present invention relates to a decoder circuit. This decoder circuit is connected to one of a group of word lines which are arranged in a matrix form. Each word line is connected to a large number of binary cells. By using the decoder circuit according to the present invention, one of a large number of binary cells is selected randomly so as to write or read the data.

DESCRIPTION OF THE PRIOR ART

A dynamic random access memory MISFET integrated circuit which is conventionally used so as to write or read the data into or from a great number of address storage cells is disclosed in U.S. Pat. No. 3,969,706. As illustrated in FIG. 10 of U.S. Pat. No. 3,969,706, a decoder circuit is connected to each one of a group of word lines which are arranged in a matrix form. Each word line is connected to a plurality of storage cells and the decoder circuits determine whether or not the decoder selects (i.e., drives) the word line. This decoder circuit includes: a charge-up transistor for maintaining the content of an input address signal; a power supply switching transistor for controlling a charge-up current which is supplied to the charge-up transistor; a predetermined number of selection transistors which are connected at a connection node between the charge-up transistor and the power supply switching transistor so as to select an output word line, and; a bootstrap transistor which is connected at an opposite side of the connection node with respect to the charge-up transistor.

In the above described conventional decoder circuit, when the selection transistors do not select the word line, occasionally only one of the selection transistors is placed in the on state. Therefore, when the electric charges stored in the connection node of the selection transistors are discharged by the selection transistors which are placed in the on state, a long time is required for the potential level to drop in the connection node, the remaining charges at the connection node keep the bootstrap transistor in the on state and a selection output is supplied to the word line, thus a malfunction is caused and the information stored in the memory cells is destroyed.

SUMMARY OF THE INVENTION

An object of the present invention is to provide a decoder circuit which can prevent a malfunction from occurring when the word line is not selected.

Another object of the present invention is to provide a decoder circuit which can rapidly discharge the charges which are stored when the word line is not selected.

For the purpose of achieving the above mentioned objects, the decoder circuit according to the present invention comprises: a charge-up transistor for maintaining the content of an input address signal; a power supply switching transistor for controlling a charge-up current which is supplied to the charge-up transistor; a predetermined number of selection transistors which are connected at a connection node between the charge-up transistor and the power supply switching transistor and which select an output word line; a bootstrap transistor which is connected at an opposite side of the connection node with respect to the charge-up transistor; a first clock pulse generating circuit which generates first clock pulses for driving the power supply switching transistor, and; a second clock pulse generating circuit which generates second clock pulses having a level higher than the power supply voltage $V_{DD}$ for driving the charge-up transistor.

Further features and advantages of the present invention will be apparent from the ensuing description with reference to the accompanying drawings to which, however, the scope of the invention is in no way limited.

DETAILED DESCRIPTION OF THE PREFERRED EMBODIMENT

Figure 1:
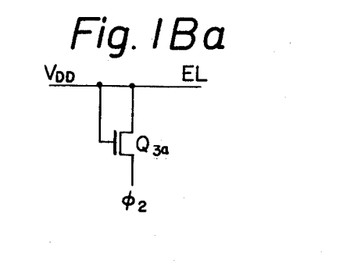
Figure 1A:
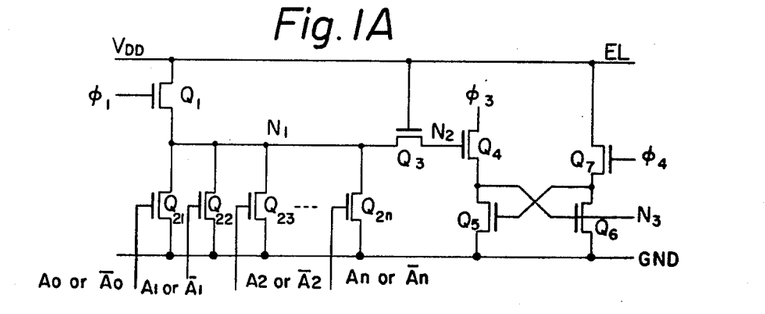
FIGS. 1A, 1B, 1Ba and 1C are schematic diagrams of a conventional decoder circuit.
Figure 1B:
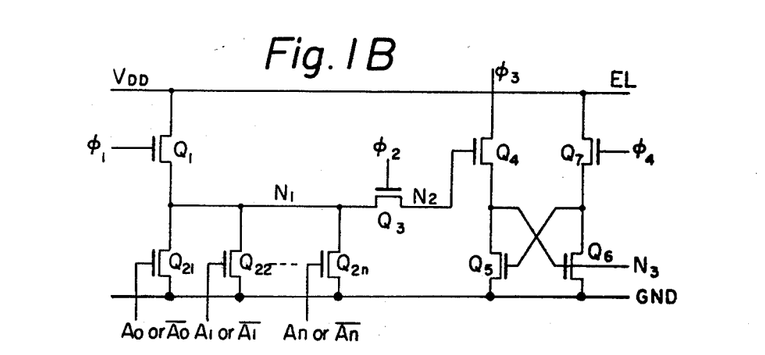
Figure 1C:
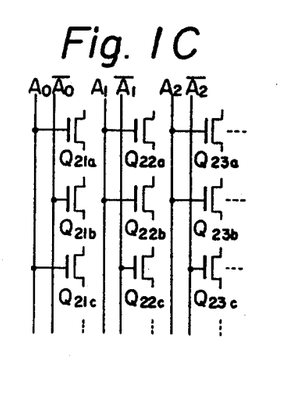

FIG. 1A illustrates a conventional decoder circuit. This decoder circuit is one of the decoder circuits which are connected to word lines of row and column circuits of a matrix. One example of the connection between address lines for selecting the desired cell in the matrix and the decoder circuit is illustrated in FIG. 1C.

In the decoder circuit illustrated in FIG. 1A, the inputs of each decoder are connected to address lines $A_0$ or $\overline{A}_0$; $A_1$ or $\overline{A}_1$; $A_2$ or $\overline{A}_2$; ..., $A_n$ or $\overline{A}_n$ and the output of each decoder is connected to a word line of a row or column of the matrix. Referring to FIG. 1A and FIG. 1B, EL designates a power supply line, $Q_1$ a power supply switching transistor, $Q_{21}$, $Q_{22}$, $Q_{23}$, ..., $Q_{2n}$ selection transistors and $Q_3$ a charge-up transistor, $Q_4$ designates a bootstrap transistor, $Q_5$ and $Q_7$ designate low level clamp transistors, $Q_6$ a transistor for releasing a low level clamp transistor, and $N_1$, $N_2$ and $N_3$ each is a connection node; $\phi_1$, $\phi_2$ and $\phi_3$ designate clock pulse signals, A0-An designates address signal lines and GND designates a ground.

In the circuit illustrated in FIG. 1A, the nodes $N_1$ and $N_2$ are charged via the transistor $Q_1$ to a potential $V_{DD} - V_{th}$, during a reset time, by using a clock pulse signal $\phi_1$ wherein $V_{DD}$ is the power supply line voltage and $V_{th}$ is the threshold voltage of the transistor $Q_1$. The transistors $Q_{21}$, $Q_{22}$, $Q_{23}$, ..., $Q_{2n}$ are connected between node $N_1$ and ground, and the gates of the transistors $Q_{21}$, $Q_{22}$, $Q_{23}$, ..., $Q_{2n}$ are connected to the address lines $A_0$ or $\overline{A}_0$; $A_1$ or $\overline{A}_1$; $A_2$ or $\overline{A}_2$; ...; $A_n$ or $\overline{A}_n$ as illustrated in FIG. 1C. The charge-up transistor $Q_3$ is connected between the node $N_1$ and the node $N_2$ (that is, the gate of transistor $Q_4$). The bootstrap transistor $Q_4$ determines whether the potential level of the node $N_3$ is a logic high or low in accordance with the voltage level in the node $N_2$ when the clock pulse $\phi_3$ is received. The gate of transistor $Q_3$ is connected to the potential level $V_{DD}$, so that the potential level at the gate of the transistor $Q_4$ is driven to a potential higher than the power supply line potential $V_{DD}$.

In the circuit illustrated in FIG. 1A, when transistor $Q_1$ is placed in the on state by a first clock pulse $\phi_1$ being applied thereto, at a reset time, the nodes $N_1$ and $N_2$ are charged up to the potential level of $V_{DD}-V_{th}$, because the gate of the transistor $Q_3$ is connected to the power supply line voltage $V_{DD}$.

If we assume that the proper address signals are supplied to transistors $Q_{21}$, $Q_{22}$, $Q_{23}$, ..., $Q_{2n}$, the potential levels in the nodes $N_1$ and $N_2$ in the selected decoder circuits are not changed because transistors $Q_{21}$, $Q_{22}$, $Q_{23}$, ..., $Q_{2n}$ are kept in the off state by the address signals Ao-n or Āo-n. However, the electric charges in the nodes $N_1$ and $N_2$ in the non-selected decoder circuits are discharged because at least one of the transistors $Q_{21}$, $Q_{22}$, $Q_{23}$, ..., $Q_{2n}$ is placed in the on state by the address signals Ao-n or Āo-n.

In the selected decoder circuit, when a clock pulse signal $\phi_3$ is supplied to transistor $Q_4$, and $\phi_3$ becomes equal to $V_{DD}$, the level at the node $N_2$ is increased to a potential higher than that of $V_{DD}+V_{th}$ due to the capacitance of transistor $Q_4$. Therefore, an output signal appears at the node $N_3$ and the potential level at the node $N_3$ becomes equal to $V_{DD}$. In the non-selected decoder circuit, since no charge exists on the nodes $N_1$ and $N_2$, the above mentioned function is not carried out, and therefore, the transistor $Q_4$ is placed in the off state and no output appears at the node $N_3$.

When the non-selected decoder discharges the charges on the nodes $N_1$ and $N_2$, it is preferable that all transistors $Q_{21}$, $Q_{22}$, ..., $Q_{2n}$ are kept in the on state. However, this is very rare, and sometimes it is necessary for the discharge to be carried out by only one transistor. In such a case, a long time is required for the potential to drop at the nodes $N_1$ and $N_2$ and, further, the discharge of the electric charges on the node $N_3$ is more difficult because the potential level at the gate of transistor $Q_3$ is fixed at the power supply line potential $V_{DD}$. Therefore, when a clock signal $\phi_3$ is applied to transistor $Q_4$, the charge left at the node $N_2$ sometimes places transistor $Q_4$ in the on state and the output appears at the node $N_3$ so that a malfunction is caused. The node $N_3$ is usually connected to the word line and, therefore, if a malfunction is caused, the information which is stored in the memory cells attached thereto is destroyed.

In a conventional circuit, the gate of the transistor $Q_3$ is usually connected to the power supply line potential $V_{DD}$, as illustrated in FIG. 1A. However, sometimes the gate ($\phi_2$) of the transistor $Q_3$ is connected to the source of the transistor $Q_{3a}$, the gate and the drain of which are connected to the power supply line, as illustrated in FIGS. 1B and 1Ba. With regard to FIGS. 1B and 1Ba, the plurality of the decoders illustrated in FIG. 1B are commonly connected to the transistor $Q_{3a}$ as illustrated in FIG. 1Ba.

In the circuit illustrated in FIGS. 1B and 1Ba, the potential level of the gate $\phi_2$ varies in dependence upon the mean potential level in the nodes $N_1$ and $N_2$ of the plurality of decoder circuits via the capacitance which exists between the gate and the source of the transistor $Q_3$ and between the gate and the drain of the transistor $Q_3$, and the potential level of the gate $\phi_2$ oscillates between the potential levels $V_{DD}+\alpha$ and $V_{DD}-V_{th}$ because of the following:

When the address signals A or Ā are applied to the decoder circuit, the nodes $N_1$ and $N_2$ of all of the decoders except the selected decoder are grounded, and the gate $\phi_2$ of the transistor $Q_3$ is charged up to the potential level $V_{DD}-V_{th}$ via the transistor $Q_{3a}$. When the decoder is placed in the reset state, the clock pulse $\phi_1$ is input, and the nodes $N_1$ and $N_2$ are charged up, the potential level of the gate $\phi_2$ is raised to $V_{DD}+\alpha$ due to the capacitance of the transistor $Q_3$. After the nodes $N_1$ and $N_2$ are sufficiently charged and the decoder is placed in the reset state, the potential level of the clock pulse $\phi_1$ is grounded GND, and the nodes $N_1$ and $N_2$ are placed in a floating state. Then, when the address signals A or Ā are input to the decoder circuits, the charges on the nodes $N_1$ and $N_2$ of the non-selected decoder circuits are discharged. When the charges on the nodes $N_1$ and $N_2$ are discharged, the potential level of the gate $\phi_2$ drops due to the capacitance of the transistor $Q_3$, and when the nodes $N_1$ and $N_2$ are grounded, the potential level of the gate $\phi_2$ of the transistor $Q_3$ becomes equal to $V_{DD}-V_{th}$. As mentioned above, the potential level of the gate $\phi_2$ of transistor $Q_3$ follows the mean value of the potential level of the non-selected decoder and the potential level of the gate $\phi_2$ oscillates between the potential levels $V_{DD}+\alpha$ and $V_{DD}-V_{th}$.

Next, the circuit illustrated in FIGS. 1B and 1Ba and the circuit illustrated in FIG. 1A will be compared. In the circuit illustrated in FIGS. 1B and 1Ba, the potential level of the gate $\phi_2$ is placed at $V_{DD}+\alpha$ at the time the nodes $N_1$ and $N_2$ begin to discharge. Therefore, the mutual conductance $g_m$ of the transistor $Q_3$ is higher than in the circuit illustrated on FIG. 1A and the electric charges in the node $N_2$ in the circuit illustrated in FIGS. 1B and 1Ba discharge at first more rapidly than the circuit illustrated in FIG. 1A. However, when the potential levels of the nodes $N_1$ and $N_2$ fall to near ground level, the potential level of the gate $\phi_2$ falls to near $V_{DD}-V_{th}$, and therefore, the mutual conductance $g_m$ falls to a value lower than that of the circuit illustrated in FIG. 1A and the discharge of the charges on the node $N_2$ is delayed.

As mentioned above, in the circuit illustrated in FIGS. 1B and 1Ba as well as in the circuit illustrated in FIG. 1A, the discharge of the electric charges on the node $N_2$ is not carried out sufficiently, and a malfunction may be caused.

In the present invention, the potential level of the gate $\phi_2$, illustrated in FIG. 1B, oscillates between the two potential levels of $V_{DD}$ and $V_{DD}+\alpha$, so that the mutual conductance $g_m$ of transistor $Q_3$ is increased, causing the discharge of the electric charge on the node $N_2$ to be rapidly carried out and thus preventing a malfunction of the decoder.

Figure 2:
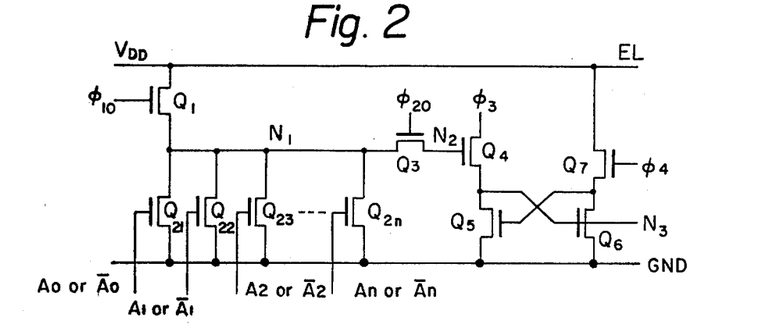
FIG. 2 is a schematic diagram of one embodiment of the decoder circuit according to the present invention.

Further, in a conventional decoder circuit, the potential level of the clock pulse $\phi_1$ is $V_{DD}$ and the potential levels at the nodes $N_1$ and $N_2$ are equal to $V_{DD}-V_{th}$. However, in the decoder circuit according to the present invention, the potential level of the clock pulse $\phi_1$ is higher than $V_{DD}+V_{th}$ and the charge-up potential levels in the nodes $N_1$ and $N_2$ are equal to $V_{DD}$. By increasing the potential level in the node $N_2$ from $V_{DD}-V_{th}$ to $V_{DD}$, if the transistor $Q_4$ is of a small size, the mutual conductance $g_m$ of the transistor $Q_4$ can be held at that value which is held by the transistor $Q_4$ when the potential level at the node $N_2$ is equal to $V_{DD}-V_{th}$. If the transistor $Q_4$ is small, the capacitance of the transistor is decreased, the electric charges on the node $N_2$ can be discharged rapidly and malfunction of the decoder can be prevented. The reason for this is as follows:

FIG. 2 illustrates the decoder circuit according to the present invention. The differences between the circuit illustrated in FIG. 2 and the conventional circuits illustrated in FIGS. 1A, 1B and 1Ba, are that the potential level at the gate of the transistor $Q_3$ oscillates between $V_{DD}$ and $V_{DD}+V_{th}$ and the potential level of the clock pulses $\phi_{10}$ is raised to a value higher than $V_{DD}+V_{th}$. As a result of this, the electric charges on the node $N_2$ can be rapidly discharged and a malfunction of the decoder circuit can be prevented.

Figure 3:
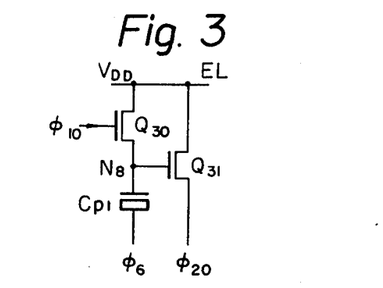
FIG. 3 is a schematic diagram of one example of the circuit which generates clock pulses for driving the charge-up transistor illustrated in FIG. 2.
Figure 4:
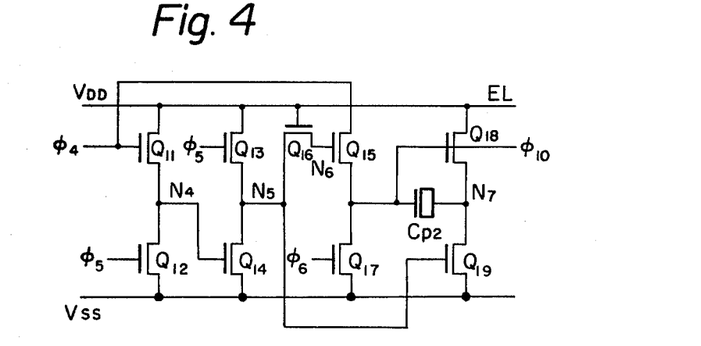
FIG. 4 is a schematic diagram of one example of the circuit which generates clock pulses for driving the power supply switching transistor illustrated in FIG. 2.
Figure 5:
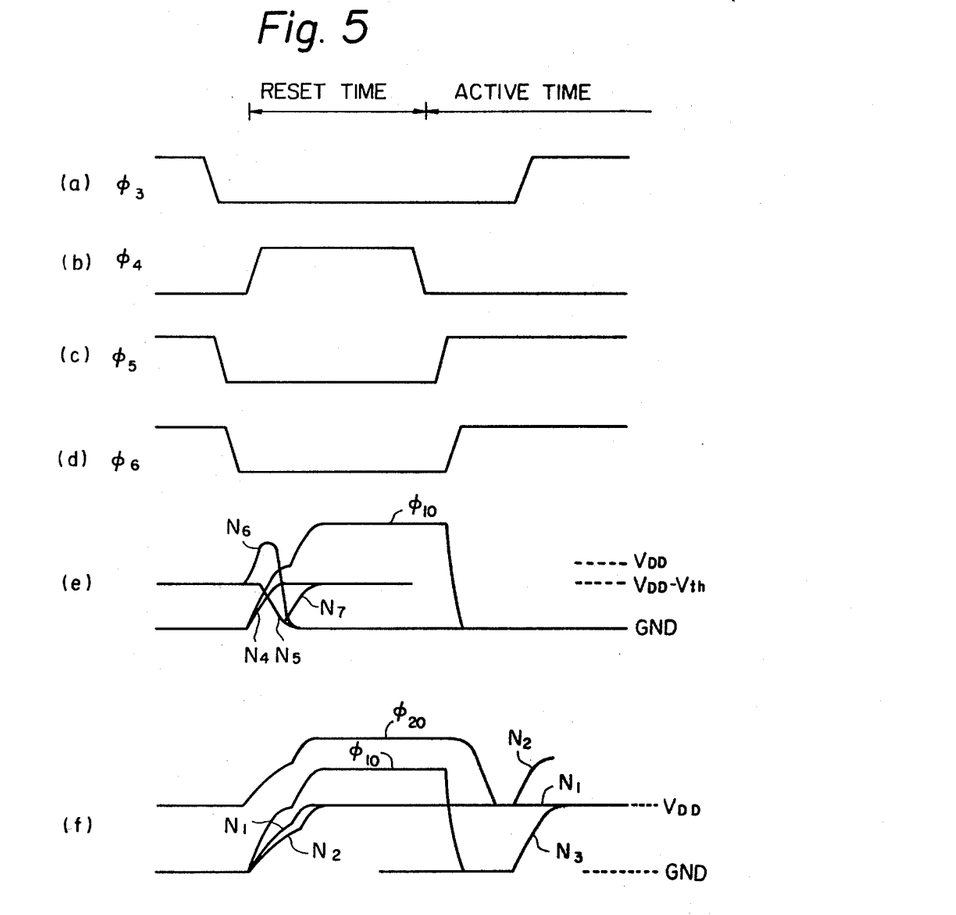
FIG. 5 is a graphical representation of various waveforms useful in connection with the description related to FIGS. 2, 3 and 4.

The following is an explanation of the operation of the circuit for oscillating the clock pulse signal $\phi_{20}$ between levels $V_{DD}$ and $V_{DD}+\alpha$, and the circuit for raising the potential level of the clock pulse signal $\phi_{10}$ to the value higher than $V_{DD}+V_{th}$. FIG. 3 illustrates a circuit for generating the clock pulse signal $\phi_{20}$. FIG. 4 illustrates a circuit for generating the clock pulse signal $\phi_{10}$ and FIG. 5 is a graphical representation of various waveforms useful in connection with the description related to FIGS. 2, 3 and 4. Referring to FIGS. 4 and 5, a clock pulse signal $\phi_4$ is used for resetting the low level clamp transistor $Q_5$ and, further, for driving the circuit illustrated in FIG. 4 to generate the clock pulses signal $\phi_{10}$ with a potential level $V_{DD}+V_{th}$ during a predetermined reset time. Clock pulse signal $\phi_5$ is used for resetting the circuit illustrated in FIG. 4 and clock pulse signal $\phi_6$ is used to make a clock pulse $\phi_{10}$ low before the address signals Ao-n or $\overline{Ao\text{-}n}$ are input after the nodes $N_1$ and $N_2$ are charged up to the potential level $V_{DD}$ in the circuit illustrated in FIG. 2, thus keeping transistor $Q_1$ in the off state. Clock pulse signal $\phi_6$ is also used for keeping the node $N_8$ shown in FIG. 3 at a potential level higher than $V_{DD}+V_{th}$ and for keeping the clock pulse signal $\phi_{20}$ at a potential level $V_{DD}$ during the active time of the circuit illustrated in FIG. 3. The clock pulse signals are generated by the clock pulse generator.

The clock pulse generating circuit for generating the clock pulse signal $\phi_{20}$ comprises, as illustrated in FIG. 3: a transistor $Q_{30}$, the drain of which is connected to the power supply line voltage $V_{DD}$ and the gate of which receives the clock pulse signal $\phi_{10}$; a capacitor $C_{P1}$, one terminal of which is connected to the source of the transistor $Q_{30}$ and which receives the clock pulse signal $\phi_6$, on its other terminal and; the transistor $Q_{31}$, the gate of which is connected to the connection node between the transistor $Q_{30}$ and the capacitor $C_{P1}$, the drain of which is connected to the power supply line voltage $V_{DD}$ and the source of which provides the clock pulse signal $\phi_{20}$. In the circuit illustrated in FIG. 3, during the reset time, the node $N_8$ is charged to the potential level $V_{DD}$ by transistor $Q_{30}$ using the clock pulse signal $\phi_{10}$ having a potential level $V_{DD}+V_{th}$. During the active time, the potential level of the node $N_8$ is caused to rise to $V_{DD}+V_{th}$ by the clock pulse signal $\phi_6$ and the capacitor $C_{P1}$, so that the potential level of the clock signal $\phi_{20}$ is charged to the potential level $V_{DD}$. By applying the clock signal $\phi_{20}$ to the gate of the transistor $Q_3$ illustrated in FIG. 2, the potential level at the gate of the transistor $Q_3$ oscillates between $V_{DD}$ and $V_{DD}+\alpha$, in accordance with the potential levels at the nodes $N_1$ and $N_2$ of the decoder circuit, as illustrated in (f) of FIG. 5. In the circuit illustrated in FIG. 3, the potential level of the clock pulse signal $\phi_{10}$ is not necessary higher than $V_{DD}+V_{th}$. If it is assumed that the input potential at the gate of the transistor $Q_{30}$ is $V_{DD}$, a capacitor having a capacitance larger than that of $C_{P1}$ in FIG. 3 should be used for the purpose of raising the node $N_8$ to a potential level higher than $V_{DD}+V_{th}$.

In the circuit illustrated in FIG. 4, the circuit for generating the clock pulse signal $\phi_{10}$ comprises: a series circuit of a transistor $Q_{11}$, which receives the clock pulse signal $\phi_4$, as illustrated in (b) of FIG. 5; a transistor $Q_{12}$, which receives the clock pulse signal $\phi_5$ having an opposite phase with respect to the clock pulse signal $\phi_4$, as illustrated in (c) of FIG. 5; a series circuit of transistor $Q_{13}$, which receives the clock pulse signal $\phi_5$ of FIG. 5; a transistor $Q_{14}$, having a gate which is connected to a connection node between transistors $Q_{11}$ and $Q_{12}$; a transistor $Q_{15}$, having a drain which receives the clock pulse signal $\phi_4$; a transistor $Q_{16}$, having a gate which is connected to the power supply line voltage $V_{DD}$, and a source and a drain which are connected respectively to a connection node between transistors $Q_{13}$ and $Q_{14}$ and to the gate of transistor $Q_{15}$; a transistor $Q_{17}$, having a drain and a source which are connected between the source of transistor $Q_{15}$ and ground GND and a gate which receives the clock pulse signal $\phi_6$; a series circuit of transistor 18, having a gate which is connected to a connection node between the transistors $Q_{15}$ and $Q_{17}$; a transistor $Q_{19}$, having an input which is connected to a connection node between the transistors $Q_{13}$, $Q_{14}$ and $Q_{16}$, and; a MOS capacitor $C_{P2}$, which is connected between the connection node of transistors $Q_{15}$ and $Q_{17}$ and the connection node of transistors $Q_{18}$ and $Q_{19}$.

In the circuit illustrated in FIG. 4, if the clock pulse signal $\phi_4$, as illustrated in (b) of FIG. 5, is received during the reset time, the potential level in the node $N_4$ rises and, as a result, transistor $Q_{14}$ is placed in the on state and the potential level at the node $N_5$ falls; furthermore, the clock pulse signal $\phi_4$ is also applied to transistor $Q_{15}$ and, as a result, the potential level at the node $N_6$ rises and the transistor $Q_{15}$ is placed in the on state, so that the potential level of the clock pulse signal $\phi_{10}$ is raised by the application of clock pulse signal $\phi_4$. At the same time, the potential level at the node $N_5$ falls, the charge on the node $N_6$, (the potential level of which is raised), is discharged to the node $N_5$ and transistor $Q_{16}$ is placed in the off state. Further, at the same time, the potential level at the node $N_7$ rises and the potential level of the clock pulse signal $\phi_{10}$ is raised to a potential level higher than $V_{DD}+V_{th}$ by the bootstrap effect of MOS capacitor $C_{P2}$, as illustrated (e) of FIG. 5, and this clock pulse signal $\phi_{10}$ is applied to the gate of the transistor $Q_1$, illustrated in FIG. 2.

As mentioned above, according to the present invention, the potential level of the clock pulse signal for driving the charge-up transistor which holds the content of an input address signal is oscillated between $V_{DD}$ and $V_{DD}+\alpha$, so that the mutual conductance $g_m$ of the charge-up transistor can be increased. Further, the potential level of the clock pulse signal for driving the power supply switching transistor, which supplies the charge-up current to the charge-up transistor, is raised to a value higher than $V_{DD}+V_{th}$, so that the capacitance of the node from which the electric charges are discharged can be decreased and the charges in the non-selected decoder can be rapidly discharged. Therefore, the distruction of the memory cells caused by a malfunction of the decoder can be prevented. Further, the bootstrap effect in the bootstrap transistor is increased, because the potential level in the bootstrap transistor is increased.

What is claimed is:

1. A decoder circuit, connected to a power supply line having a power supply source voltage $V_{DD}$, comprising:
   a charge-up transistor for maintaining the content of an input address signal;
   a power supply switching transistor, operatively connected to said charge-up transistor, for controlling a charge-up current which is supplied to said charge-up transistor;
   a predetermined number of selection transistors which are connected at a connection node between said charge-up transistor and said power supply switching transistor, said selection transistors enabling the selection of an output word line;
   a bootstrap transistor which is connected at an opposite side of said connection node with respect to said charge-up transistor;
   a first clock pulse generating circuit which generates first clock pulses for driving said power supply switching transistor, and;
   a second clock pulse generating circuit which generates second clock pulses, having a maximum potential level higher than power supply source voltage $V_{DD}$, for driving said charge-up transistor.

2. A decoder circuit according to claim 1, wherein said first clock pulses have a maximum voltage level higher than $V_{DD}+V_{th}$ and wherein $V_{th}$ is equal to the threshold voltage value of said power supply switching transistor.

3. A decoder circuit according to claim 2, wherein said first clock pulse generating circuit comprises:
   a first series circuit of a first transistor for receiving third clock pulse signals for charging a low level clamp transistor and a second transistor for receiving fourth clock pulse signals, generated at a predetermined active time;
   a second series circuit of a third transistor for receiving said fourth clock pulse signals and a fourth transistor having an input which is connected to a connection node between said first transistor and said second transistor;
   a fifth transistor having a drain for receiving said third clock pulse signals;
   a sixth transistor having a gate which is connected to said power supply line, and a source and a drain which are connected respectively to a connection point between said third and fourth transistors and a gate of said fifth transistor;
   a seventh transistor having a drain which is connected to the source of said fifth transistor and receives a fifth clock pulse;
   a third series circuit of an eighth transistor having an input which is connected to a connection node between said fifth transistor and said seventh transistor, and a ninth transistor having an input which is connected to a connection node between said third transistor and said fourth transistor, and;
   a capacitor which is connected between a connection node of said fifth and said seventh transistors and a connection node of said eighth and said ninth transistors.

4. A decoder circuit according to claim 1 or 2, wherein said decoder circuit further comprises a low level clamping transistor which is connected in series with said bootstrap transistor.

5. A decoder circuit according to claim 4, wherein said first clock pulse generating circuit comprises:
   a first series circuit of a first transistor for receiving third clock pulse signals for charging a low level clamp transistor and a second transistor for receiving fourth clock pulse signals, generated at a predetermined active time;
   a second series circuit of a third transistor for receiving said fourth clock pulse signals and a fourth transistor having an input which is connected to a connection node between said first transistor and said second transistor;
   fifth transistor having a drain for receiving said third clock pulse signals;
   a sixth transistor having a gate which is connected to said power supply line, and a source and a drain which are connected respectively to a connection point between said third and fourth transistors and a gate of said fifth transistor;
   a seventh transistor having a drain which is connected to the source of said seventh transistor and receives a fifth clock pulse;
   a third series circuit of an eighth transistor having an input which is connected to a connection node between said fifth transistor and said seventh transistor, and a ninth transistor having an input which is connected to a connection node between said third transistor and said fourth transistor, and;
   a capacitor which is connected between a connection node of said fifth and said seventh transistors and a connection node of said eighth and said ninth transistors.

6. A decoder circuit according to claim 1, wherein said second clock pulse generating circuit comprises a first transistor having a drain which is connected to said power supply line, said first transistor having a gate which receives said first clock pulses, a first capacitor which is connected to said first transistor for receiving third clock pulses and second transistor having a gate which is connected to a connection node between said first transistor and said first capacitor, said second transistor having a drain which is connected to said power line and a source for providing a fourth clock pulse signal which is the same as said second clock pulses.

7. A decoder circuit, connected to a power supply line having a power supply source voltage, comprising:
   an FET charge-up transistor for maintaining the content of an input address signal;
   an FET power supply switching transistor, having its drain operatively connected to said power supply line and having its source operatively connected to the source of said FET charge-up transistor at a first node, for controlling a charge-up current which is supplied to said FET charge-up transistor;
   a predetermined number of FET selection transistors for selecting an output word line, wherein:
   the drains of said predetermined number of FET selection transistors are connected at said first node, the sources of said predetermined number of FET selection transistors are operatively connected to ground, and wherein each of the gates of said predetermined number of FET selection transistors receives an input address signal;
   a first clock pulse generating circuit, operatively connected to the gate of said FET power supply switching transistor, for generating first clock pulse signals for driving said FET power supply switching transistor;

a second clock pulse generating circuit, operatively connected to the gate of said FET charge-up transistor, for generating second clock pulse signals having a maximum potential level higher than power supply source voltage for driving said FET charge-up transistor, and an FET bootstrap transistor having its gate operatively connected to the drain of said FET charge-up transistor and having its drain operatively connected to receive third clock pulse signals.

8. A decoder circuit according to claim 7, wherein said second clock pulse generating circuit comprises:

a first FET, wherein the drain of said first FET is connected to said power supply line and the gate of said first FET is operatively connected to receive said first clock pulse signals;

a first capacitor having a first terminal connected to the source of said first FET and having a second terminal operatively connected to receive fourth clock pulse signals; and a second FET, having its drain connected to said power supply line, having its gate connected to said first terminal of said first capacitor and to said source of said first FET, and having its source connected to the gate of said FET charge-up transistor, for providing said second clock pulses to said FET charge-up transistor.

9. A decoder circuit according to claim 8, wherein said decoder circuit further comprises an FET low level clamping transistor having a drain operatively connected to the source of said FET bootstrap transistor and having a source connected to ground.

10. A decoder circuit according to claim 9, wherein said first clock pulse generating circuit comprises:

a third FET having its drain connected to said power supply line and having its gate operatively connected to receive fifth clock pulse signals;

a fourth FET having its drain connected to the source of said third FET at a second node, having its gate operatively connected to receive sixth clock pulse signals and having its source connected to ground;

a fifth FET having its drain connected to said power supply line and having its gate operatively connected to receive said sixth clock pulse signals;

a sixth FET having its drain connected to the source of said fifth FET at a third node, having its gate connected to said second node, and having its source connected to ground;

a seventh FET having its drain operatively connected to receive said fifth clock pulse signals;

an eighth FET having its gate connected to said power supply line, having its drain connected to the gate of said seventh FET and having its source connected to said third node;

a ninth FET having its drain connected to the source of said seventh FET at a fourth node, having its source connected to ground, and having its gate operatively connected to receive said fourth clock pulse signals;

a tenth FET having its drain connected to said power supply line and having its gate connected to said fourth node and to the gate of said FET power supply switching transistor;

an eleventh FET having its drain connected to the source of said tenth FET at a fifth node, having its gate connected to said third node, and having its source connected to ground; and a second capacitor having a first terminal connected to said fourth node and having a second terminal connected to said fifth node.

* * * * *

UNITED STATES PATENT AND TRADEMARK OFFICE
CERTIFICATE OF CORRECTION

PATENT NO. : 4,267,464

DATED : May 12, 1981

INVENTOR(S) : YOSHIHIRO TAKEMAE ET AL.

It is certified that error appears in the above-identified patent and that said Letters Patent is hereby corrected as shown below:

Front Page, [73] Assignee, "Fujitsu Fanuc Limited," should be --Fujitsu Limited, Kanagawa, Japan--;

Front Page, [57] Abstract, line 16, "Vth" should be --Vth,--;
line 18, "V+h" should be --Vth--.

Col. 2, line 63, after "tween" insert --the--, and "of the" should be --of--.

Col. 3, line 11, delete "of";
line 19, "Ao-n" (first occurrence) should be --$\underline{A0\text{-}n}$--, and "Ao-n" (second occurrence) should be --$\overline{A0\text{-}n}$--;
line 23, "$\underline{Ao\text{-}n}$" should be --A0-n--, and "$\overline{Ao\text{-}n}$" should be --$\overline{A0\text{-}n}$--;
line 57, "of the" should be --of--.

Col. 4, line 35, "on" should be --in--;
line 36, "in" should be --at--.

Col. 5, line 27, "pulses" should be --pulse--;
line 31, "make a" should be --make--;
line 32, "Ao-n" should be --A0-n--, and "$\overline{Ao\text{-}n}$" should be --$\overline{A0\text{-}n}$--;
line 68, "necessary" should be -necessarily--.

UNITED STATES PATENT AND TRADEMARK OFFICE
CERTIFICATE OF CORRECTION

PATENT NO. : 4,267,464

DATED : May 12, 1981

INVENTOR(S) : YOSHIHIRO TAKEMAE ET AL.

It is certified that error appears in the above—identified patent and that said Letters Patent is hereby corrected as shown below:

Col. 6, line 13, "05" should be --05;--;
       line 14, delete "of FIG. 5,";
       line 25, "18" should be --$Q_{18}$--;
       line 27, "an input" should be --a gate--;
       line 50, before "(e)", insert --in--;
       line 66, "distruction" should be --destruction--.

Col. 7, line 23, ", and;" should be --; and--;
       line 60, ", and;" should be --; and--.

Col. 8, line 13, "fifth" should be --a fifth--;
       line 21, "seventh" should be --fifth--;
       line 22, "fifth" should be --seventh--;
       line 28, ", and;" should be --; and--;
       line 42, after "power" insert --supply--.

Col. 9, line 6, "," should be --;--.

Signed and Sealed this

Seventeenth Day of November 1981

[SEAL]

Attest:

GERALD J. MOSSINGHOFF

Attesting Officer     Commissioner of Patents and Trademarks